United States Patent
Du

(10) Patent No.: US 11,533,027 B2
(45) Date of Patent: Dec. 20, 2022

(54) LOW POWER RECEIVER CIRCUIT FOR ISOLATED DATA COMMUNICATIONS

(71) Applicant: Analog Devices, Inc., Norwood, MA (US)

(72) Inventor: Xiao Hong Du, Wilmington, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 16/657,863

(22) Filed: Oct. 18, 2019

(65) Prior Publication Data

US 2021/0119590 A1    Apr. 22, 2021

(51) Int. Cl.
  *H03F 3/24* (2006.01)
  *H04B 1/04* (2006.01)
  *H04B 1/16* (2006.01)

(52) U.S. Cl.
  CPC ........... *H03F 3/245* (2013.01); *H04B 1/0458* (2013.01); *H04B 1/16* (2013.01)

(58) Field of Classification Search
  CPC .......... H03F 3/245; H04B 1/0458; H04B 1/16
  USPC .......................................................... 375/295
  See application file for complete search history.

(56) References Cited

U.S. PATENT DOCUMENTS

| | | | |
|---|---|---|---|
| 4,747,035 A * | 5/1988 | Bobry | H02M 5/293 315/371 |
| 5,952,849 A | 9/1999 | Haigh | |
| 6,249,171 B1 | 6/2001 | Yaklin et al. | |
| 6,445,330 B1 | 9/2002 | Thomsen et al. | |
| 6,617,846 B2 | 9/2003 | Hayat-Dawoodi et al. | |
| 7,031,458 B2 | 4/2006 | Holcombe et al. | |
| 7,489,526 B2 | 2/2009 | Chen et al. | |
| 7,545,059 B2 | 6/2009 | Chen et al. | |
| 7,683,654 B2 | 3/2010 | Chen et al. | |
| 7,692,444 B2 | 4/2010 | Chen et al. | |
| 7,755,400 B2 | 7/2010 | Jordanger et al. | |
| 7,773,733 B2 | 8/2010 | Bark et al. | |
| 7,796,076 B2 | 9/2010 | Melanson | |
| 7,902,627 B2 | 3/2011 | Dong et al. | |
| 8,198,951 B2 | 6/2012 | Dong et al. | |
| 8,736,343 B2 | 5/2014 | Chen et al. | |
| 8,829,955 B1 | 9/2014 | Goswami | |
| 9,608,623 B1 | 3/2017 | Kandah et al. | |
| 9,660,848 B2 | 5/2017 | Yun et al. | |
| 9,680,528 B2 | 6/2017 | Shrestha | |
| 9,871,488 B2 * | 1/2018 | Lin | H03F 3/217 |

(Continued)

FOREIGN PATENT DOCUMENTS

| | | |
|---|---|---|
| CN | 101304251 A | 11/2008 |
| CN | 101877683 A | 11/2010 |

OTHER PUBLICATIONS

EP 20200572.4, dated Mar. 10, 2021, Partial European Search Report.

(Continued)

*Primary Examiner* — Kevin M Burd
(74) *Attorney, Agent, or Firm* — Wolf, Greenfield & Sacks, P.C.

(57) ABSTRACT

Data isolators are described. The data isolators include a differential receiver having cross-coupled single-ended amplifiers. The single-ended amplifiers may be referenced to a time-varying reference potential. The cross-coupling of the single-ended amplifiers may provide high speed, low power consumption operation of the data isolator.

20 Claims, 11 Drawing Sheets

(56) References Cited

U.S. PATENT DOCUMENTS

| | | | |
|---|---|---|---|
| 2003/0042571 | A1 | 3/2003 | Chen et al. |
| 2006/0061350 | A1* | 3/2006 | Myers .................. G01R 15/202 |
| | | | 324/117 R |
| 2007/0003055 | A1 | 1/2007 | Bark et al. |
| 2008/0030080 | A1 | 2/2008 | Chen et al. |
| 2009/0206960 | A1 | 8/2009 | Ng et al. |
| 2009/0295451 | A1* | 12/2009 | Jordanger ........... H04L 25/4902 |
| | | | 327/333 |
| 2014/0169038 | A1 | 6/2014 | Kamath et al. |
| 2015/0303985 | A1* | 10/2015 | Sharma ................ H03G 3/3047 |
| | | | 375/297 |
| 2016/0080182 | A1 | 3/2016 | Yun et al. |
| 2017/0005630 | A1* | 1/2017 | Stampalia ............... H03F 3/265 |
| 2018/0041200 | A1 | 2/2018 | Lynch et al. |
| 2020/0003830 | A1* | 1/2020 | Lu ...................... G01R 31/2856 |
| 2021/0067182 | A1* | 3/2021 | Ravi ........................ H01Q 3/40 |

OTHER PUBLICATIONS

Partial European Search Report dated Mar. 10, 2021 in connection with European Application No. 20200572.4.

Gingerich et al., The ISO72x Family of High-Speed Digital Isolators. Application Report SLLA198—Jan. 2006. Jan. 1, 2006; 12 pages. Retrieved from the Internet: url:http://www.ti.com/lit/an.sllal98/slla198.pdf.

Extended European Search Report dated Jun. 10, 2021 in connection with European Application No. 20200572.4.

\* cited by examiner

LOW POWER RECEIVER CIRCUIT FOR ISOLATED DATA COMMUNICATIONS

BACKGROUND

Field

The present application relates to data isolators.

Related Art

Isolators provide electrical isolation between circuits which communicate with each other. In some situations, circuits which communicate with each other operate at different voltages, for instance one at a relatively high voltage and the other at a relatively low voltage. In some situations, the circuits are referenced to different electrical ground potentials. Isolators can be used to electrically isolate circuits in either of these situations.

Some isolators are used to isolate data signals sent from one circuit to another, or from one voltage domain to another. Some data isolators are single-ended, and others are differential.

BRIEF SUMMARY

According to some embodiments, a low power differential data isolator circuit is provided, comprising: a transmitter; an isolator; and a differential receiver comprising first and second single-ended amplifiers that are cross-coupled with each other.

According to some embodiments, a differential data isolator circuit, comprising: a transmitter; an isolator; and a differential receiver comprising a first single-ended amplifier referenced to a time-varying reference potential.

According to some embodiments, a differential receiver circuit of a data isolator system is provided, comprising: a first signal path comprising a first single-ended amplifier; and a second signal path comprising a second single-ended amplifier coupled to the first single-ended amplifier.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

According to an aspect of the present application, data isolators are provided that have a differential receiver, also referred to herein as a differential receiver circuit, made up of single-ended amplifiers that are coupled to each other. Some implementations of the differential receiver circuit include cross-coupled single-ended amplifiers, meaning that two single-ended amplifiers are connected to each other in a cross-coupled arrangement. A reference (or ground) terminal for a first of the single-ended amplifiers may be coupled to an input of the second single-ended amplifier, and a reference (or ground) terminal for the second single-ended amplifier may be coupled to an input of the first single-ended amplifier.

According to an aspect of the present application, data isolators are provided that have a differential receiver circuit having an amplifier that is referenced to a time-varying potential. As opposed to having the amplifiers of the differential receiver referenced to static potentials, such as static power supplies and ground, at least one amplifier of the differential receiver circuit is referenced to an electrical potential that changes over time. In some implementations, the amplifier is referenced to a signal received by the isolator and input to another amplifier of the differential receiver circuit. As the input to the other amplifier changes over time, the reference potential for the first amplifier changes.

Data isolators according to the various aspects described herein may exhibit beneficial characteristics. For example, the data isolators may allow for high speed operation. They may provide the benefits of differential signaling in terms of accuracy and robustness. They may also operate at power levels associated with single-ended amplifiers, rather than the higher power levels typically associated with differential amplifiers. Thus, at least some embodiments of the data isolators described herein may provide the benefits of both differential and single-ended circuit configurations, including low power and high speed operation.

Figure 1:
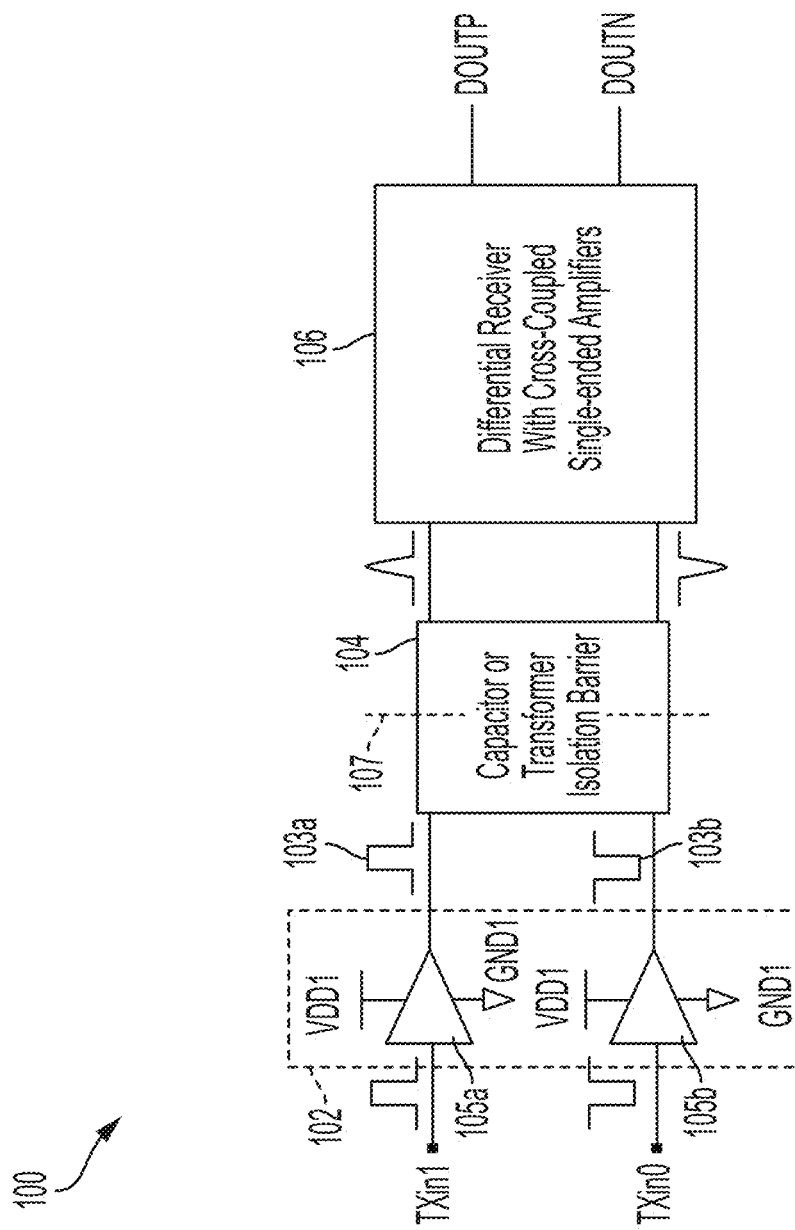
FIG. 1 is a circuit diagram of a data isolator with a differential receiver, according to a non-limiting embodiment of the present application.

FIG. 1 illustrates a differential isolator according to an aspect of the present application. The differential data isolator 100 comprises a transmit circuit 102, isolator 104, and receiver circuit 106. The receiver circuit 106 is a differential receiver having cross-coupled single-ended amplifiers. The transmit circuit 102 may be any suitable circuit for transmitting a differential signal comprising signal 103a and 103b across the isolator 104. In the illustrated non-limiting example, the transmit circuit comprises drivers 105a and 105b, but alternatives are possible, as the various aspects of the present application are not limited to the particular type of transmit circuit.

The isolator 104 may be one of various types of isolators, including a capacitive isolator or a transformer isolator. The isolator 104 may bridge an isolation barrier 107, which may be formed by a dielectric material in some embodiments.

Figure 2:
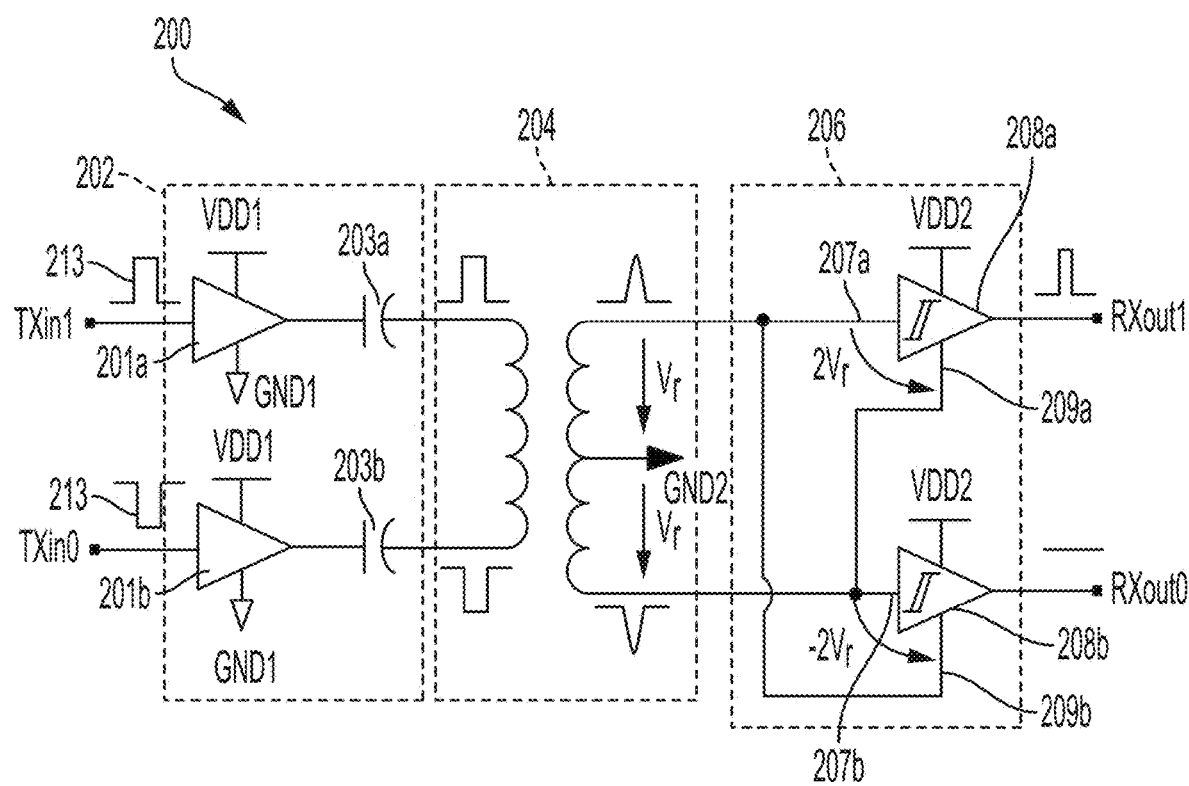
FIG. 2 illustrates a non-limiting example of an implementation of the data isolator of FIG. 1, including two cross-coupled single-ended amplifiers in the differential receiver.

FIG. 2 illustrates a non-limiting example of the receiver circuit 106 of FIG. 1, showing two cross-coupled single-ended amplifiers. The data isolator 200 comprises transmit circuit 202 having drivers 201a and 201b referenced to power supply VDD1 and ground GND1 and capacitors 203a and 203b, isolator 204, and receiver circuit 206. The receiver circuit 206, which is an example of receiver circuit 106 of FIG. 1, includes single-ended amplifiers 208a and 208b. The single-ended amplifiers 208a and 208b are cross-coupled, and are in respective signal paths between the isolator 204 and the output terminals RXout1 and RXout0. Single-ended amplifier 208a has an input terminal 207a configured to receive the signal from the isolator 204 but also coupled to a reference, or ground, terminal 209b of single-ended amplifier 208b. Likewise, single-ended amplifier 208b has an input terminal 207b configured to receive the signal from the isolator 204 but also coupled to a reference, or ground, terminal 209a of the single-ended amplifier 208a. As shown, single-ended amplifiers 208a and 208b are also referenced to a power supply VDD2, and they have respective output terminals RXout1 and RXout0.

In operation, a differential input signal 213 may be applied to terminals TXin1 and TXin0 of the transmit circuit 202. The drivers 201a and 201b drive the signal across capacitors 203a and 203b, and the isolator 204 to the receiver circuit 206. In the illustrated non-limiting example, the isolator 204 is a center-tapped transformer referenced to ground GND2, but alternatives are possible. The received signal is input to the single-ended amplifiers 208a and 208b at input terminals 207a and 207b. The output signals of those single-ended amplifiers are constrained between VDD2 and the input signal to the other single-ended amplifier, resulting in output signals at the output terminals RXout1 and RXout0. The cross-coupling configuration illustrated ensures low-power consumption operation of the data isolator 200.

Figure 3:
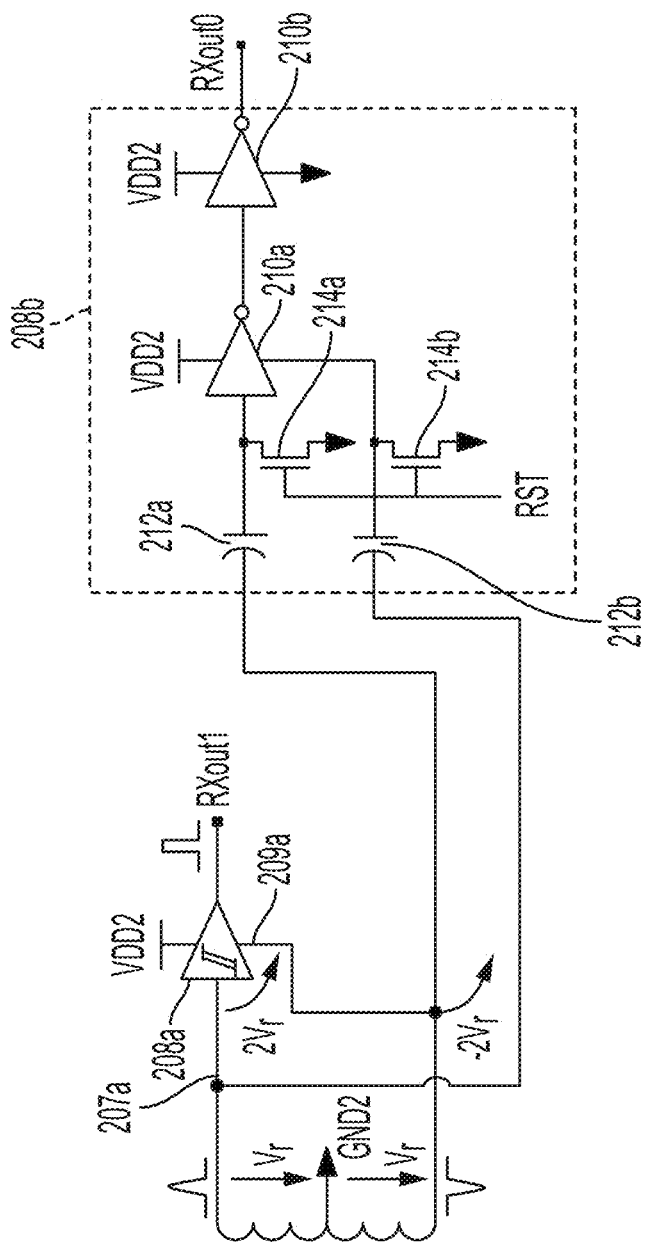
FIG. 3 illustrates some of the components of the circuit of FIG. 2 in greater detail, showing a non-limiting example of one of the single-ended amplifiers of the circuit of FIG. 2.
Figure 4:
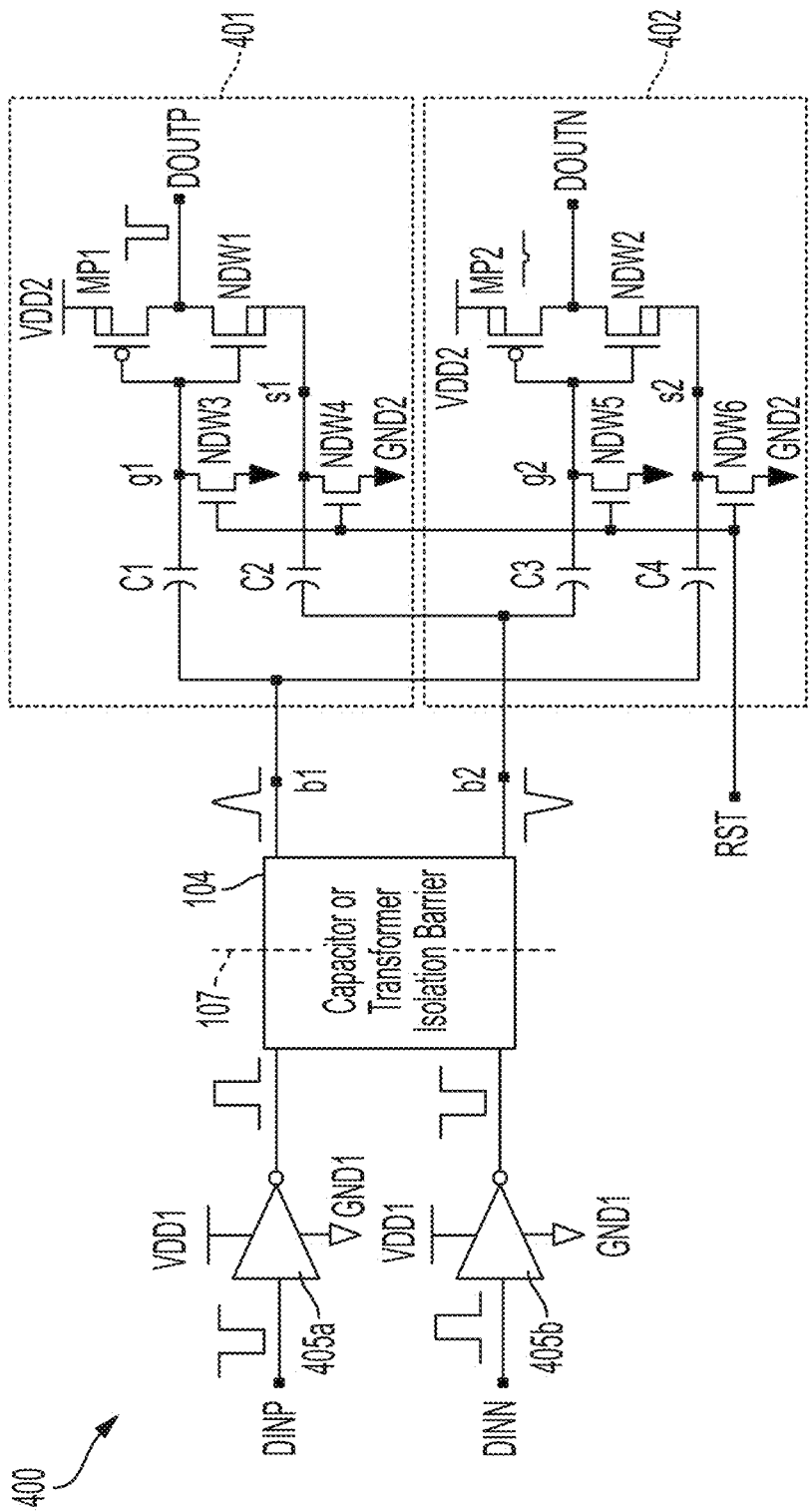
FIG. 4 is a non-limiting example of a differential data isolator with an embodiment of a differential receiver, according to a non-limiting embodiment of the present application.

The single-ended amplifiers 208a and 208b may take any suitable form. FIG. 3 illustrates a non-limiting example of the single-ended amplifier 208b. The same construction may be used for single-ended amplifier 208a. In FIG. 3, the single-ended amplifier 208b comprises inverters 210a and 210b, blocking capacitors 212a and 212b, and reset switches 214a and 214b. The inverter 210a is referenced to power supply VDD2 and the top plate of capacitor 212b which is reset to 0 volt relative to ground GND2 at the beginning of each data transmission and plays the same role of the ground as in a usual inverter. When the reset is released, the reset devices 214a and 214b are in the off state. The input terminal of inverter 210a is ac-coupled to the negative terminal of the isolator output through capacitor 212a and the reference or ground terminal of inverter 210a is ac-coupled to the positive terminal of the isolator output through capacitor 212b. As a result, the whole differential output signal of the isolator is fully applied to the input of inverter 210a, rather than using only half of the isolator output as in a conventional receiver with a single-ended amplifier having its ground hard tied to GND2. The inverter 210b may be a typical inverter referenced to VDD2 and ground. In the example shown, the inverters 210a and 210b are connected in series, or are serially connected. The reset switches 214a and 214b are used to reset the inputs of inverter 210a. The implementation of 208a is identical to that of 208b, but its inputs are ac-coupled to the output terminals of the isolator in the opposite polarity, as shown in FIG. 4.

The impact of the cross-coupling configuration shown can also be appreciated from FIG. 2. The negative terminal of the receiver (represented by single-ended amplifier 208b) is cross-coupled to the other terminal of the transformer's output, namely the input terminal 207a of the single-ended amplifier 208a, as shown in FIG. 2. As a result, the signal applied on the single-ended amplifiers are doubled to 2Vr and −2Vr, as shown. This implies a doubled signal and noise margin, a much higher common mode rejection ratio and much better reliability than if the single-ended receivers only saw voltage swings of Vr and −Vr. Although the explanation above is for transformer-based isolators, it is valid for other isolators as well, such as capacitive isolators.

In practice, the output signals of the transformer may not be equally split on the input terminals 207a and 207b. Instead, those output signals may differ slightly. Still, benefits in signal, noise margin, common mode rejection, and reliability may be realized. Consider, for example, the signals on input terminals 207a and 207b are given by Vr1 and Vr2 referring to GND2. In this case, the useful signal is either Vr1+Vr2 or −(Vr1+Vr2) in the circuits according to aspects of the present application. Either way, the useful signal is near the value of 2Vr shown in FIG. 2, and is greater than the value of Vr1 or −Vr2 that may be achieved in conventional circuits where 209a and 209b are hard tied to GND2.

It should be appreciated from the foregoing description of FIGS. 2 and 3 that embodiments of the present application provide a data isolator having a differential receiver with cross-coupled single-ended amplifiers that are referenced to a time-varying potential. For example, the single-ended amplifier 208b has a reference terminal 209b connected to the time-varying input to the single-ended amplifier 208a. In some embodiments, the single-ended amplifiers are referenced to a virtual ground, a time-dependent ground, or a variable ground.

FIG. 4 is a differential data isolator 400 with a differential receiver circuit comprising receivers 401 and 402, the combination of which represents a non-limiting implementation of the receiver circuit 106. MP1 is a PMOS transistor and NDW1 is an NMOS transistor in a deep NWELL tied to supply voltage VDD2. The source and the back gate of MP1 are tied to a supply voltage VDD2. The source and the back gate of NDW1 are tied together. The drains of MP1 and NDW1 are tied together as the output of the receiver DOUTP. The gates of MP1 and NDW1 are tied to node g1. The configuration of MP1 and NDW1 is similar to an inverter, but the source of NDW1 is tied to a non-ground node s1, rather than to ground node as is typically done in inverters. Capacitors C1 and C2 ac-couple nodes g1 and s1 to the output terminals b1 and b2 of the isolator (e.g., to the terminals of a transformer coil or to plates of capacitors), respectively. Nodes g1 and s1 are coupled to the ground by NMOS devices NDW3 and NDW4 in a deep NWELL, which reset nodes g1 and s1 to 0 V before the receiver receives any signal from the isolator 104. Circuit 402 is identical to circuit 401, but the connections to the output terminals b1 and b2 of the isolated devices are swapped for detecting signals in the opposite polarity. Thus, circuit 402 comprises transistors MP2, NDW2, NDW5, NDW6, and capacitors C3 and C4. The node g2 is coupled to the gates of MP2 and NDW2, and the node s2 is coupled to the source of NDW2. A reset signal RST is used to turn transistors NDW3, NDW4, NDW5, and NDW6 on or off.

The data isolator 400 also comprises a transmit circuit including drivers 405a and 405b, having input terminals DINP and DINN.

Figure 5:
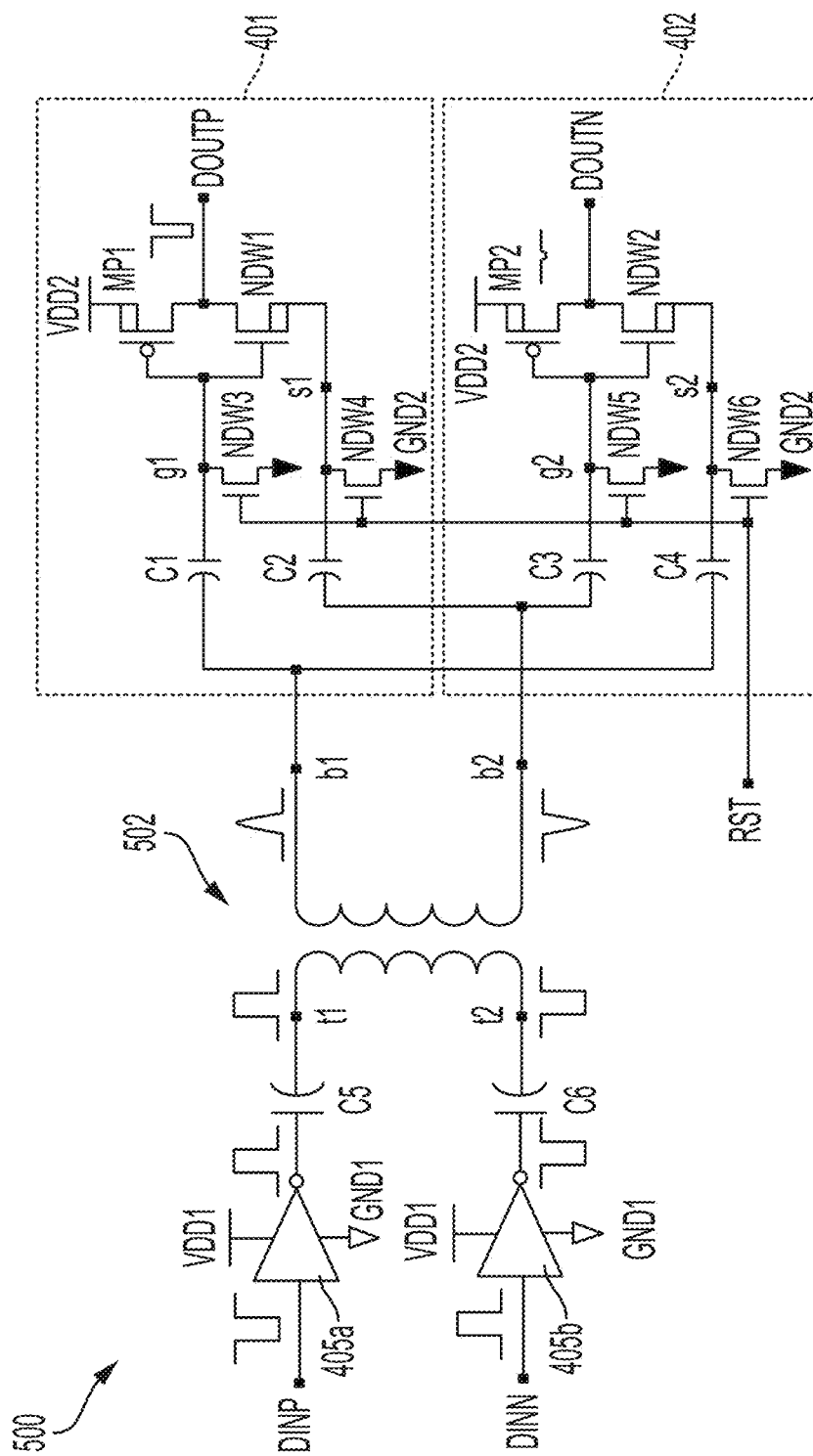
FIG. 5 is a transformer-based isolator with an embodiment of a differential receiver, according to a non-limiting embodiment of the present application.

FIG. 5 illustrates an implementation of the data isolator 400 using a transformer-based isolator. The operation of the data isolator 400 is described using the non-limiting example of data isolator 500 of FIG. 5, and by considering the voltage waveforms in FIG. 6 at the identified nodes in the circuit of FIG. 5. Specifically, FIG. 6 shows the voltage waveforms at the related nodes in FIG. 5 for transmitting/receiving a data bit "1" followed by transmitting/receiving a data bit "0".

Figure 6:
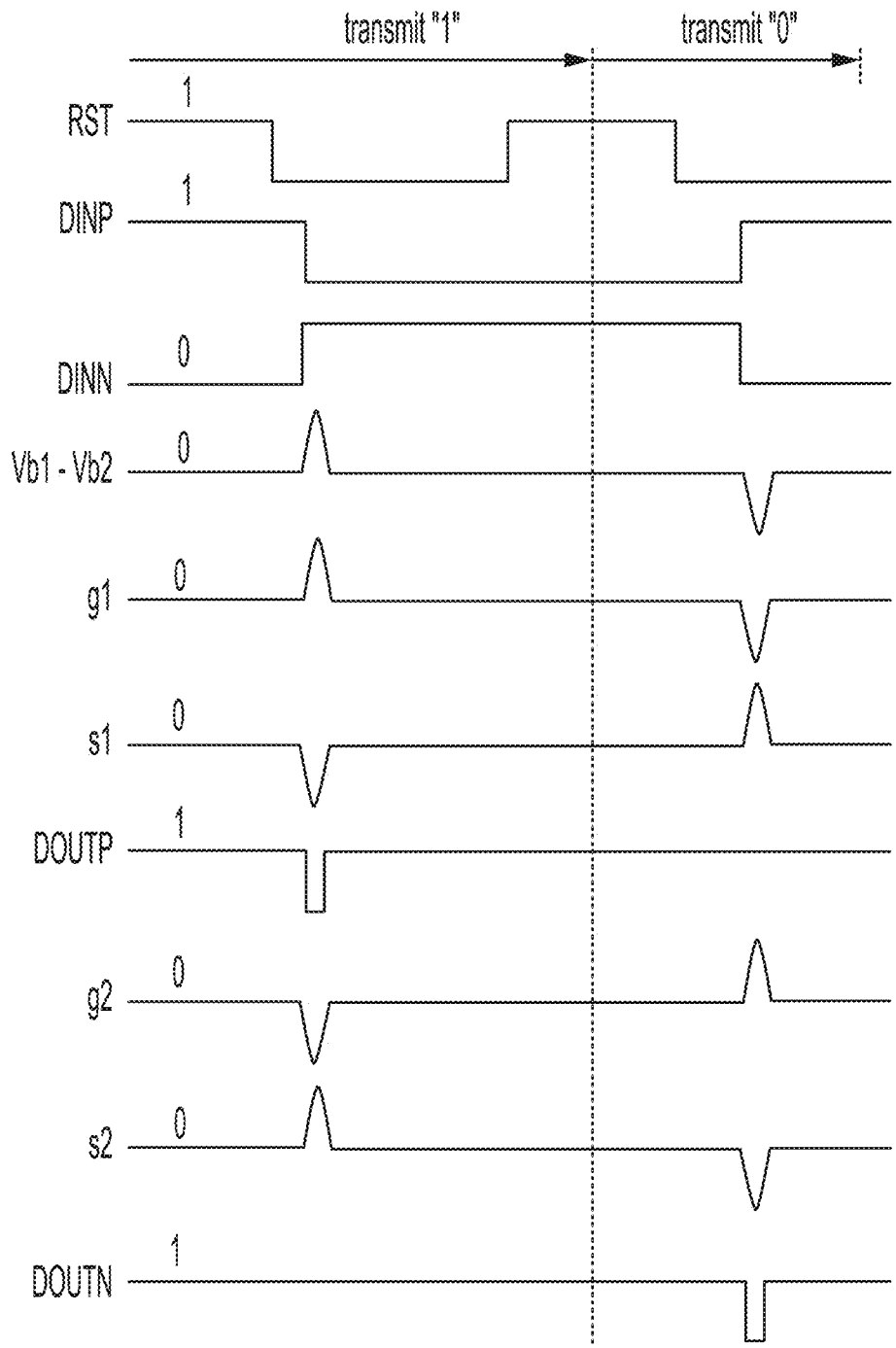
FIG. 6 illustrates timing waveforms at the related nodes in the circuit of FIG. 5 for transmitting/receiving a data bit "1" followed by transmitting/receiving a data bit "0".

Considering FIGS. 5, and 6, each transaction is started by driving RST from high to low. NMOS transistors NDW3, NDW4, NDW5, and NDW6 are turned off after resetting nodes g1, g2, s1, and s2 to 0V and output nodes DOUTP and DOUTN to the logic high state. For transmitting a logic bit "1", DINP is driven from high to low and DINN is driven from low to high simultaneously. A positive voltage pulse is applied between t1 and t2 and generates a positive voltage pulse at the output of the transformer 502, given by the voltage at node b1 minus the voltage at node b2 (i.e., Vb1–Vb2). Node g1 is then coupled to a higher voltage and s1 is coupled to a lower voltage. When the peak voltage difference between g1 and s1 is larger than the threshold of the virtual inverter formed by MP1 and NDW1, the output DOUTP is brought low and results in a negative pulse at DOUTP. On the other side of the receiver, g2 is coupled to a lower voltage and s2 is coupled to a higher voltage. Thus, there is no change at node DOUTN. A negative pulse at DOUTP with no pulse at DOUTN is interpreted as a received data bit "1." Similarly, to send a data bit "0" across the isolation barrier, a negative voltage pulse is applied between t1 and t2 by driving DINP from low to high and DINN from high to low. A negative voltage pulse is generated at the output of the transformer. Node g2 is then coupled to a higher voltage and s2 is coupled to a lower voltage. When the peak voltage difference between g2 and s2 is larger than the threshold of the virtual inverter formed by MP2 and NDW2, the output DOUTN is brought low and results a negative pulse at DOUTN. On the other side of the receiver, g1 is coupled to a lower voltage and s1 is coupled to a higher voltage. Thus, there is no change at node DOUTP. A negative pulse at DOUTN with no pulse at DOUTP is interpreted as a received data bit "0."

Since the full differential output from the transformer is used to resolve the data state, the magnitude of the signal and the noise margin are doubled compared to the signal-ended receivers mentioned previously, but the power consumption is kept the same; no static power is consumed, and only dynamic power is consumed during the data transitions.

Figure 7:
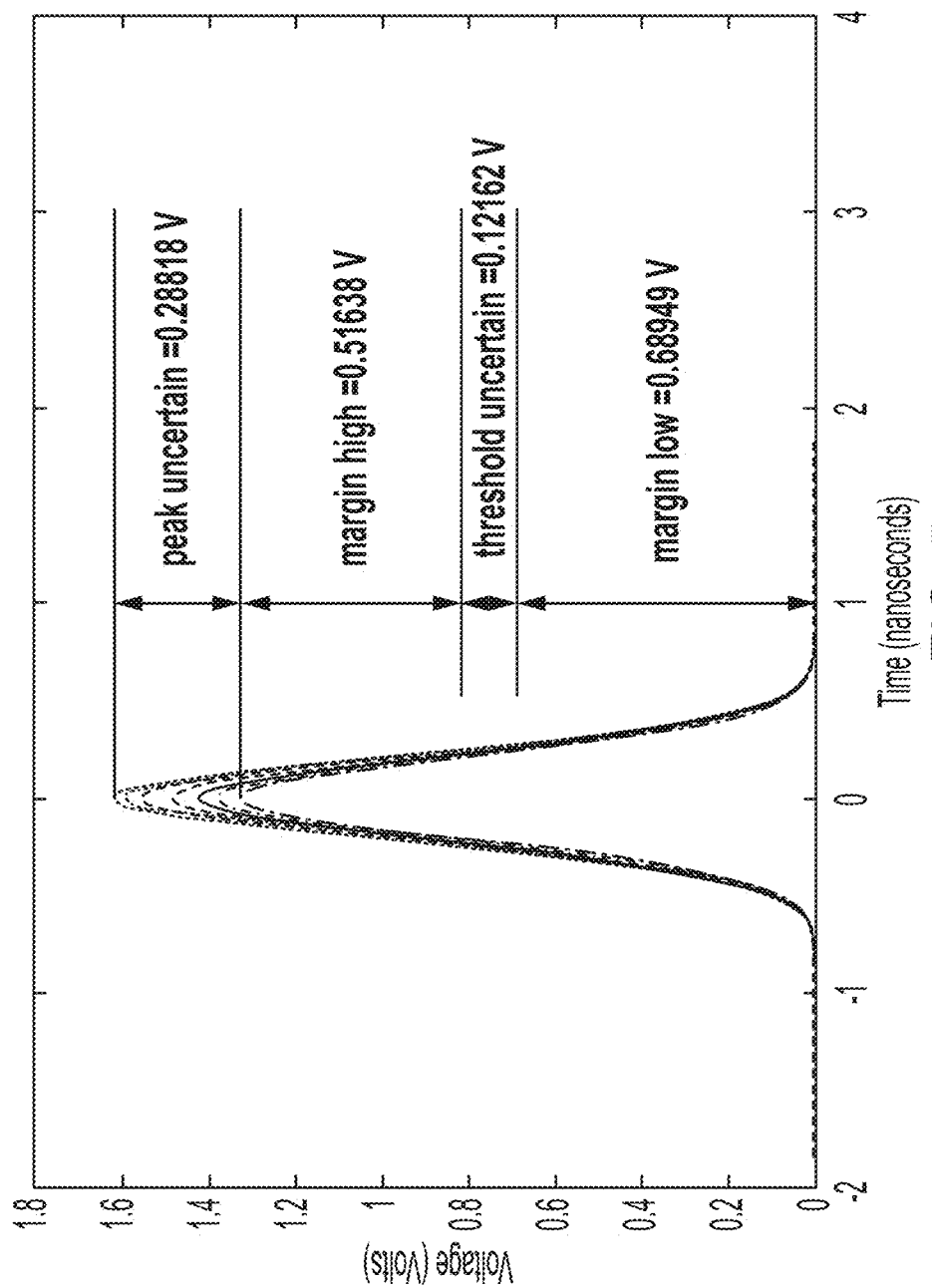
FIG. 7 shows the signal/noise margin from SPICE simulations at various Process-Voltage-Temperature (PVT) corners of a data isolator in accordance with aspects of the present application.

FIG. 7 shows the signal/noise margin from SPICE simulations at various process, voltage, temperature (PVT) corners for a differential data isolator according to an aspect of the present application. The x-axis represents time in nanoseconds, and the y-axis represents voltage, in Volts. In this non-limiting example, the supply voltage range is regulated from 1.78V to 1.83V and the temperature range is from −45° C. to 135° C. Any signal or noise magnitude higher than the threshold is interpreted to be a data bit received by the receiver. Any signal or noise magnitude below the threshold is rejected by the receiver. FIG. 7 shows about 516 mV noise margin for a true data bit to be missed and 670 mV noise margin for a false bit caused by noise. For a system with 1.8V supply voltage, those margins translate to a highly robust system. For example, during common mode transient events, a differential signal induced from the common mode must be larger than the noise margins to corrupt the data. SPICE simulations show the CMTI level for a data isolator of the types described herein may be between two and six times greater than that of alternate circuits, as an example.

Figure 8:
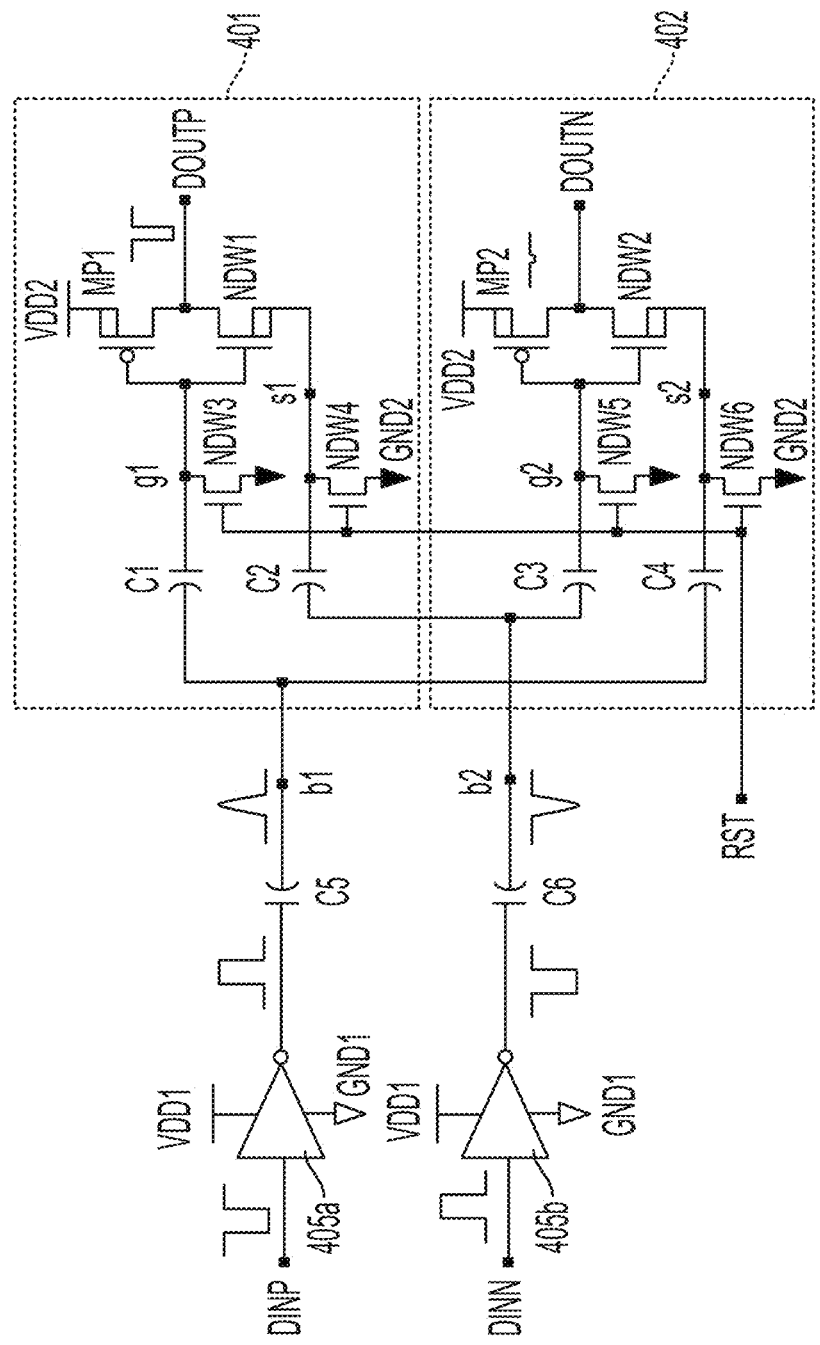
FIG. 8 is a capacitor-based isolator with an embodiment of a differential receiver, according to a non-limiting embodiment of the present application.

FIG. 8 is a capacitor-based data isolator 800 with receivers 401 and 402. The isolator is formed by capacitors C5 and C6, but otherwise the data isolator 800 is the same as data isolator 500 of FIG. 5, and the operation is similar to that of the transformer-based isolator 500.

Figure 9:
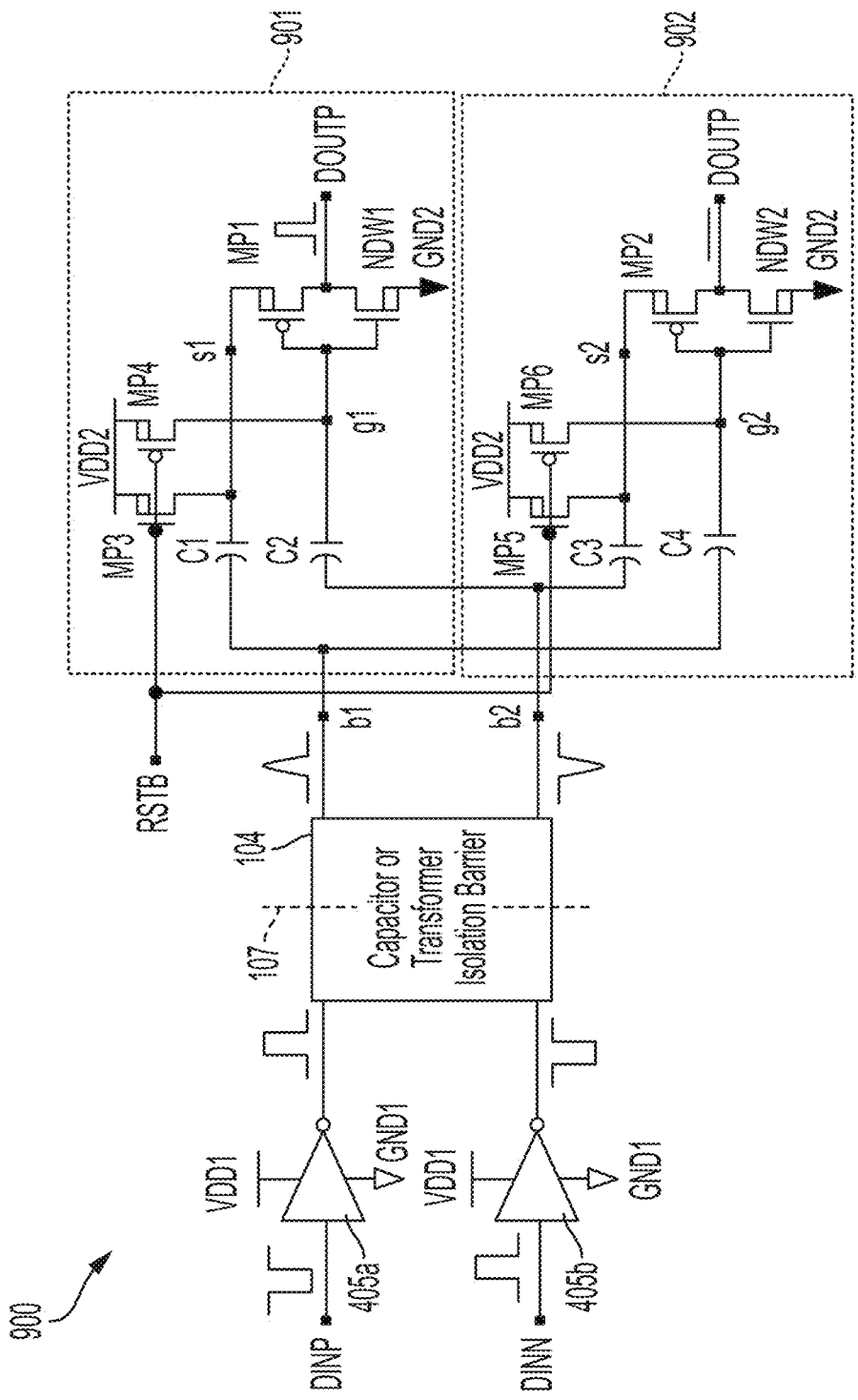
FIG. 9 is a differential data isolator with an embodiment of a differential receiver, according to a non-limiting embodiment of the present application.

FIG. 9 illustrates an alternative differential data isolator 900 with receivers 901 and 902. Receiver 901 is the dual version of receiver 401. MP1 is a PMOS transistor and NDW1 is an NMOS transistor. The source and the back gate of MP1 are tied to node s1. The source and the back gate of NDW1 are tied to ground (GND2). The drains of MP1 and NDW1 are tied together as the output of the receiver. The gates of MP1 and NDW1 are tied to node g1. The configuration of MP1 and NDW1 is like an inverter, but the source of MP1 is tied to a non-supply node s1, rather than the supply voltage in usual inverters. Capacitors C1 and C2 ac-couple nodes s1 and g1 to the output terminals b1 and b2 of the isolator 104, respectively. Nodes g1 and s1 are coupled to the supply voltage VDD2 by PMOS transistors MP3 and MP4, which reset nodes g1 and s1 to the supply voltage before the receiver receives any signal. The reset signal RSTB controls MP3 and MP4. Receiver 902 is identical to receiver 901, but the connections to the output terminals b1 and b2 of the isolator 104 are swapped for detecting signals in the opposite polarity. Unlike receivers 401 and 402, the NMOS transistors NDW1 and NDW2 in receivers 901 and 902 do not have to be inside a deep n well.

Figure 10:
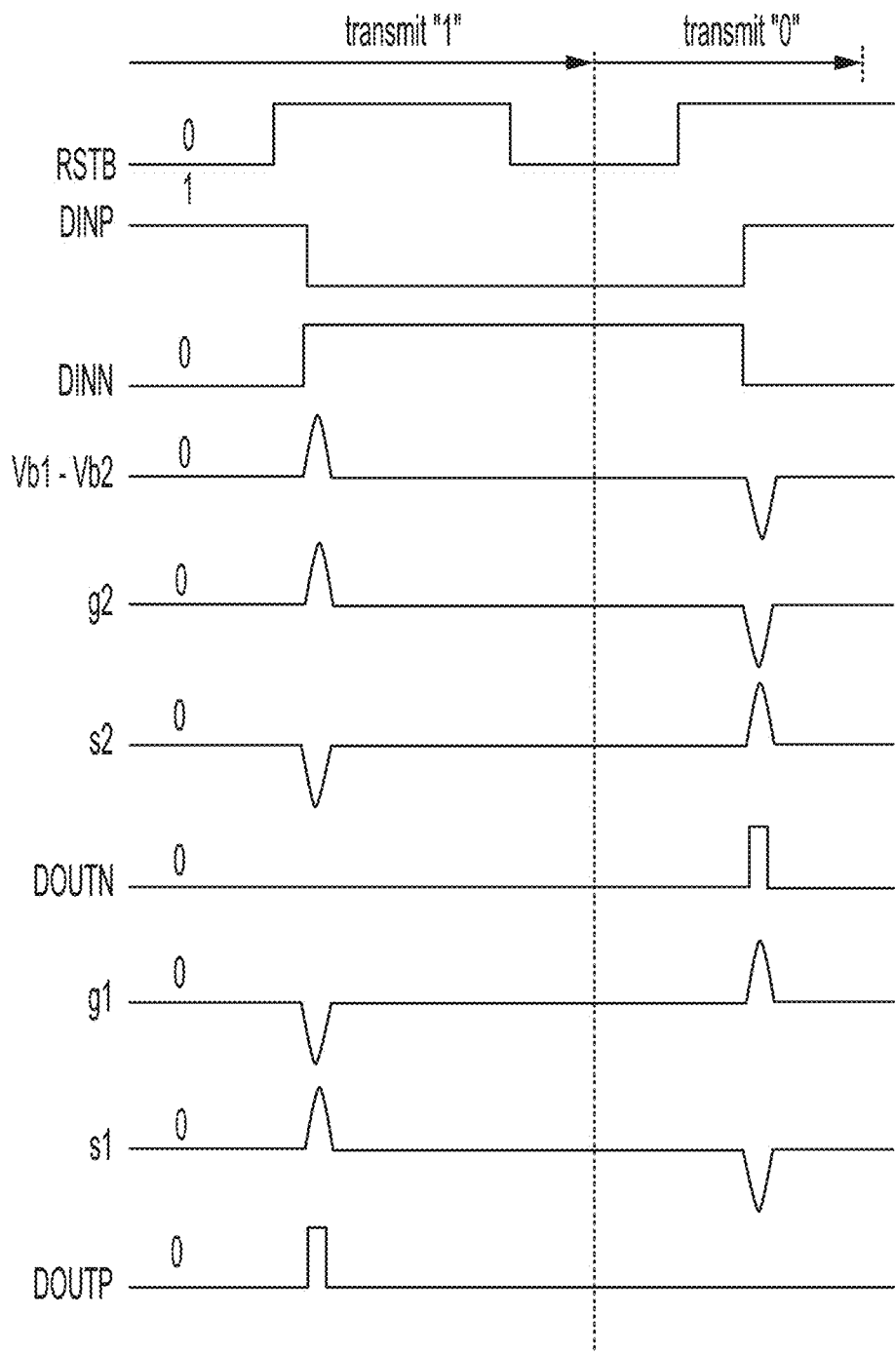
FIG. 10 shows the voltage waveforms at the related nodes in the circuit of FIG. 9 for transmitting/receiving a data bit "1" followed by transmitting/receiving a data bit "0".

FIG. 10 shows the voltage waveforms at the identified nodes in FIG. 9 for transmitting/receiving a data bit "1" followed by transmitting/receiving a data bit "0". Each transaction is started by driving RSTB from low to high. PMOS transistors MP3, MP4, MP5, and MP6 are turned off after setting nodes g1, g2, s1, and s2 to VDD2 and output nodes DOUTP and DOUTN to the logic low state 0V. For transmitting a logic bit "1", DINP is driven from high to low and DINN is driven from low to high simultaneously. A positive voltage pulse is applied to the input of the isolator and generates a positive voltage pulse at the output "Vb1–Vb2". Node g1 is then coupled to a lower voltage and s1 is coupled to a higher voltage. When the peak voltage difference between s1 and g1 is larger than the threshold of the virtual inverter formed by MP1 and NDW1, the output DOUTP is brought high and results in a positive pulse at DOUTP. On the other side of the receiver, g2 is coupled to a higher voltage and s2 is coupled to a lower voltage. Thus, there is no change at node DOUTN. A positive pulse at DOUTP with no pulse at DOUTN is interpreted as a received data bit "1." Similarly, to send a data bit "0" across the isolation barrier, a negative voltage pulse is applied between t1 and t2 by driving DINP from low to high and DINN from high to low. A negative voltage pulse is generated at the output "Vb1–Vb2" of the transformer. Node g2 is then coupled to a lower voltage and s2 is coupled to a higher voltage. When the peak voltage difference between s2 and g2 is larger than the threshold of the virtual inverter formed by MP2 and NDW2, the output DOUTN is brought high and results in a positive pulse at DOUTN. On the other side of the receiver, g1 is coupled to a higher voltage and s1 is coupled to a lower voltage. Thus, there is no change at node DOUTP. A positive pulse at DOUTN with no pulse at DOUTP is interpreted to a data bit "0" received.

Data isolators of the types described herein may be implemented in different physical arrangements. Accordingly to one embodiment, the transmit circuit, isolator, and receive circuit may all be implemented on a single semiconductor die, or chip. Alternatively, those components may be implemented on two or more semiconductor die. For example, the isolator may be a on a first die, and the transmit and receive circuits may be on respective die, or may share a die.

Figure 11:
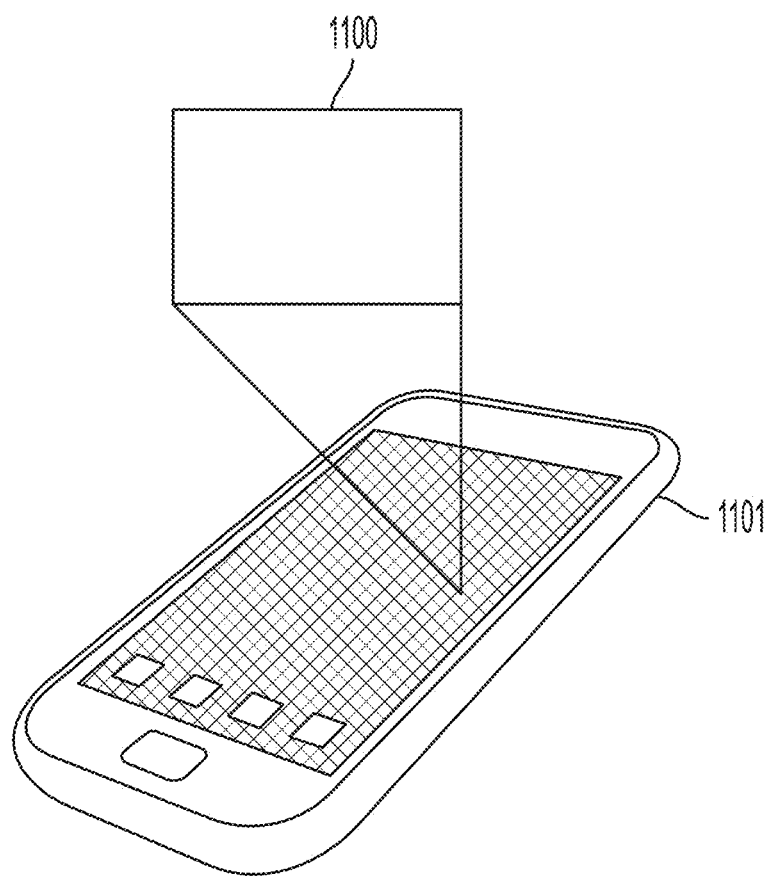
FIG. 11 illustrates a portable electronic device incorporating a low power receiver circuit for an isolator, according to a non-limiting embodiment of the present application.

Data isolators of the types described herein may be used in various devices and settings. For example, the multi-mode power isolators may be used for isolation in medical equipment systems, industrial equipment systems, physical measurement systems, or personal or portable electronic equipment. FIG. 11 is a schematic diagram showing a non-limiting application of a low power data isolator system in a portable electronic device setting, according to some embodiments. A data isolator system 1100 may be used in a portable electronic device 1101 to transmit data across an isolation barrier at high speed and with low power consumption. The portable electronic device 1101 may be a smartphone, personal digital assistant (PDA), tablet or other portable device. Other such devices may make use of data isolators systems of the types described herein.

While FIG. 11 illustrates an example of a portable electronic device 1101 incorporating aspects of the present application, other uses are possible. For example, one or more data isolator systems 1100 may be employed in an automobile or a medical instrument. Various embodiments of the present application may be implemented to provide multi-mode feedback control in a power isolator system.

Aspects of the present application provide various benefits. Some non-limiting examples have been described, and are now described. Not all embodiments provide all benefits, and benefits other than those listed may be realized. Embodiments of the present disclosure provide low power and high speed differential data isolators. The differential data isolators may be either capacitive or transformer-based isolators. Data isolators with benefits of differential signal processing and the low power benefits of single-ended signal processing are provided in at least some embodiments. According to an aspect of the present application, a data isolator comprises an isolator element (transformer or capacitor) and receiver with cross-coupled amplifiers. The amplifiers can be two single-ended amplifiers or two simple inverters. The power consumption of the isolator may be consistent with that of single-ended isolators, while providing the benefits of differential signaling. Aspects of the present application provide data isolators that exhibit the advantages of differential receivers operating on differential signals, such as maximizing the noise margin and improving the common mode transient immunity (CMTI) level.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A low power differential data isolator circuit, comprising:
a transmitter;
an isolator; and
a differential receiver comprising first and second single-ended amplifiers that are cross-coupled with each other, the cross-coupling comprising a coupling between the second single-ended amplifier and a non-control terminal of a transistor of the first single-ended amplifier, wherein:
the first single-ended amplifier comprises an output terminal distinct from the non-control terminal of the transistor of the first single-ended amplifier; and
the first single-ended amplifier is configured to receive a single input signal at a signal input terminal.

2. The low power differential data isolator circuit of claim 1, wherein the first single-ended amplifier has a reference terminal coupled to a signal input terminal of the second single-ended amplifier.

3. The low power differential data isolator circuit of claim 2, wherein the second single-ended amplifier has a reference terminal coupled to the signal input terminal of the first single-ended amplifier.

4. The low power differential data isolator circuit of claim 1, wherein the isolator is a transformer or a capacitor.

5. The low power differential data isolator circuit of claim 1, wherein the first and second single-ended amplifiers are in separate signal paths of the differential receiver.

6. The low power differential data isolator circuit of claim 1, wherein the isolator is a center-tapped transformer.

7. The low power differential data isolator of claim 1, the first single-ended amplifier comprises first and second inverters coupled in series.

8. The low power differential data isolator of claim 7, wherein the first inverter has a reference terminal coupled directly to a signal input terminal of the second single-ended amplifier.

9. A differential data isolator circuit, comprising:
a transmitter;
an isolator; and
a differential receiver comprising a first single-ended amplifier referenced to a time-varying reference potential, the time-varying reference potential being coupled to a non-control terminal of a transistor of the first single-ended amplifier, wherein:
the first single-ended amplifier comprises an output terminal distinct from the non-control terminal of the transistor of the first single-ended amplifier; and
the first single-ended amplifier is configured to receive a single input signal at a signal input terminal.

10. The differential data isolator circuit of claim 9, further comprising a second single-ended amplifier, and wherein the time-varying reference potential is an input signal to the second single-ended amplifier.

11. The differential data isolator circuit of claim 10, wherein the differential receiver is integrated on a chip separate from the isolator.

12. The differential data isolator circuit of claim 10, wherein the first single-ended amplifier comprises an inverter referenced to the time-varying reference potential.

13. The differential data isolator circuit of claim 9, wherein the first single-ended amplifier comprises serially connected inverters.

14. The differential data isolator circuit of claim 13, wherein a first inverter of the serially connected inverters is referenced to the time-varying reference potential, and wherein a second inverter of the serially connected inverters is referenced to a static ground.

15. The differential data isolator circuit of claim 9, wherein the time-varying reference potential is an output of the isolator.

16. A differential receiver circuit of a data isolator system, comprising:

a first signal path comprising a first single-ended amplifier; and a second signal path comprising a second single-ended amplifier coupled to the first single-ended amplifier, the coupling comprising a coupling between the second single-ended amplifier and a non-control terminal of a transistor of the first single-ended amplifier, wherein:

the first single-ended amplifier comprises an output terminal distinct from the non-control terminal of the transistor of the first single-ended amplifier; and the first single-ended amplifier is configured to receive a single input signal at a signal input terminal.

17. The differential receiver circuit of claim 16, wherein the first and second single-ended amplifiers are cross-coupled.

18. The differential receiver circuit of claim 17, wherein the output terminal of the first single-ended amplifier is a first output terminal of the differential receiver circuit, and an output terminal of the second single-ended amplifier is a second output terminal of the differential receiver circuit.

19. The differential receiver circuit of claim 16, wherein the signal input terminal of the first single-ended amplifier and a signal input terminal of the second single-ended amplifier are coupled to respective output terminals of an isolator.

20. The differential receiver circuit of claim 16, wherein the first and second single-ended amplifiers are both referenced to a static power supply.

\* \* \* \* \*